United States Patent [19]

Jans

[11] 4,451,505

[45] May 29, 1984

[54] METHOD OF PRODUCING PRINTED CIRCUIT BOARDS

[75] Inventor: Johannes M. Jans, Evreux, France

[73] Assignee: U.S. Philips Corporation, New York, N.Y.

[21] Appl. No.: 380,165

[22] Filed: May 20, 1982

[30] Foreign Application Priority Data

May 29, 1981 [NL] Netherlands ................. 8102620

[51] Int. Cl.³ .................. B05D 3/06; B05D 3/10; B05D 1/06
[52] U.S. Cl. ......................... 427/98; 427/203; 427/205; 427/304; 427/305; 427/306; 427/427
[58] Field of Search ............... 427/98, 427, 306, 290, 427/203, 205, 304, 305

[56] References Cited

U.S. PATENT DOCUMENTS 2,690,403  9/1954  Gutzeit et al. ................. 427/290
2,956,901  10/1960  Carlson et al. ............. 427/427 X

FOREIGN PATENT DOCUMENTS 1338435  11/1973  United Kingdom .

Primary Examiner—Evan K. Lawrence
Attorney, Agent, or Firm—Norman N. Spain

[57] ABSTRACT

The manufacture of printed circuit boards on a substrate material with a thermosetting adhesive layer. The adhesive layer is roughened by spraying with a suspension of hard particles. Thereafter the surface is provided with a layer of uniformly distributed particles of a light-sensitive, semiconductive metal oxide by spraying with a suspension of said oxide particles, which oxide after exposure to light is capable of releasing copper and/or a metal which is nobler than copper from a solution of the relevant metal salt the layer is exposed to light and is sprayed prior to and/or after the exposure with a solution of the afore-said metal salt, so that metal nuclei are formed in the exposed areas. Both operations are effected by spraying and that in such a way that the semiconductive oxide and the metal salt, respectively are substantially dry when they reach the surface. After exposure, the nuclei are intensified by means of an electroless copper plating bath.

3 Claims, No Drawings

METHOD OF PRODUCING PRINTED CIRCUIT BOARDS

The invention relates to a method of producing printed circuit boards and to the products thus obtained.

GB Patent Specification No. 1,338,435 describes such a method in accordance with which an electrically conductive metal pattern is formed on a roughened thermosetting adhesive layer present on a substrate roughened adhesive layer is contacted with a liquid as a result of which the roughened surface is provided with metal nuclei, whereafter the metal nuclei are intensified with a metal layer by means of an electroless plating solution.

The thermosetting adhesive layer incorporates uniformly-distributed, finely-dispersed particles of a light-sensitive semiconductor metal oxide which, when exposed to light is capable of releasing copper and/or metal which is nobler than copper from solution of the relevant metal salt, the layer being exposed to light and being contacted prior to and/or after the exposure with such metal salt solution so that in the exposed places metal nuclei are formed which, if necessary, after removal of the excess of the metal salt, are coated with a metal layer by means of electroless metal deposition.

There are two different ways of performing said method.

In accordance with the fully additive method, the light-sensitive layer is exposed to light through a negative of the desired pattern, whereafter this pattern is obtained by intensifying a latent image consisting of metal nuclei by means of an electroless plating solution, for example a copper-plating solution.

The variant of this method consists in that after uniform exposure, a thin metal layer is deposited in the same way onto the adhesive layer whereafter, for example by means of a light-curable lacquer, a negative image of the desired pattern is formed on the thin copper layer, which image is resistant to the action of electroplating solutions, the thin copper layer is intensified in the uncoated areas with the aid of the plating solution until the desired thickness is obtained, whereafter first the cured lacquer layer and thereafter the exposed thin copper layer are removed. This variant is designated a semi-additive method.

Prior to the above-mentioned roughening process, the holes which are required for the through-connections are drilled in the substrates for the printed circuit boards. The roughening operation affects the hole wall to a much lesser extent than the surface of the substrate material, so that when the nuclei are deposited a much smaller number of these nuclei per unit area adhere to the hole wall than to the outer surface. In order to obtain a proper formation of nuclei on the hole wall, the surface of the adhesive must be subjected to further deposition operation of nuclei. One of the results thereof is that the copper layer deposited on the nuclei by electroless copper plating detaches locally from the substrate (formation of "blisters").

It is an object of the invention to provide a method which does not have the above-mentioned disadvantage and which further has the advantage that an adhesive layer applied to the substrate that does not contain light-sensitive semiconductor metal oxide can be used as a starting material.

Substrate material provided with an adhesive layer containing finely-dispersed particles of a light-sensitive semiconductive metal oxide requires a special production technique, which makes it expensive.

According to the invention, the method of producing printed circuits on an insulating or non-insulating substrate layer in which the layer is provided with a thermo-setting adhesive layer the surface of which is roughened and is contacted with a liquid so as to provide the roughened surface with metal nuclei, whereafter the metal nuclei are intensified to form a metal layer by means of an electroless plating solution and the assembly is thermally after-treated, is characterized in that the adhesive layer is roughened by spraying the layer with a suspension of hard particles having a particle size between 50 and 200 μm, that the roughened surface is provided with a layer of uniformly distributed particles of a light-sensitive semiconductive metal oxide by spraying with a suspension of said oxide particles which oxide after exposure to light is capable of releasing copper and/or a metal which is nobler than copper from a solution of the relevant metal salt whereafter the layer is exposed to light and prior to and/or after the exposure contacted with a solution of the afore-said metal salt so that metal nuclei are formed in the exposed areas, the spraying operations with the suspension of the semiconductive metal oxide and the solution of the metal salt being performed so that the particles are substantially dry when they reach the surface, without drops of the liquid being deposited on the surface.

This spraying operation without drop formation can be performed without difficulty by one skilled in the art with his normal professional knowledge. Process parameters are inter alia the distance of the spray nozzle from the surface, the shape of the jet, the relative speed of motion of the spray nozzle, the flow rate of the liquid per unit of time. Applicants have made the experiments with a standard spray gun made of stainless steel and having the finest possible apertures.

It is advantageous to increase the viscosity of the suspension and if necessary the solution of the metal salt somewhat, for example by adding glycerine. It is also advantageous to add surface-reactive substance thereto.

The method in accordance with the invention produces printed circuit boards having metal patterns and plated through holes without blisters.

The method may be performed in an additive variant or in semi-additive variant, as will be further described in the following two embodiments.

Example 1

Commercially available plate material was chosen as the starting material, the plate material consisting of epoxy resin reinforced with glass fibre, the surface of which is coated on both sides with an adhesive layer based on a butadiene-acrylonitrile-phenolformaldehyde and is protected from contamination and damage by covering it with thin aluminum foil, which adheres to the adhesive layers.

First the holes required for through-plating were drilled and thereafter the aluminum protective layers were removed by etching in a 50% by volume of hydrochloride acid solution in water at 50° C. in an etching machine, the etching solution being passed through spray nozzles and being temperature-controlled.

The adhesive layers on the plates were mechanically roughened with a 12% by volume suspension of aluminum oxide particles having a diameter of 0.07–0.13 mm in water, which suspension was sprayed against the plate at a pressure of 5.6 atmospheres. Said roughening operation was effected in a machine in which the plates were transported horizontally at a rate of 40 cm/min. past the spray nozzles which moved up and down. The machine has three chambers, namely spray chamber, a rinsing chamber and a drying chamber, in which the plates are subjected to the corresponding operations.

Thereafter the plates were sprayed in a similar machine with a suspension containing per liter:

50 g of $TiO_2$ particles having a particle size less than 0.02 μm 5 g Triton × 100, i.e. a surface-active agent composed of octylphenoxypolyethoxy ethanol 5 g glycerine and HCl to pH = 3 in water This operation was performed with a spray gun having a stainless steel nozzle with a pressure of approximately 4 atm., so that a quantity of 14 ml was sprayed per minute. These parameters were chosen so that the $TiO_2$-particles were deposited onto the plate in the almost dry state.

Thereafter the plates were sprayed in a similar machine with a solution in water containing per liter:

5 g $PdCl_2$ 5 g Tensagex, i.e. a surface-active material consisting of the Na-salt of alkyl-phenolpolyglycolether sulphate with 31% polyoxyethylene compounds, 10 g glycerine 10 g of concentrated HCl solution (d=1.19)

The pressure was 4 atm. and a quantity of 14 ml was sprayed per minute, the reagent reaching the plate almost dry. The nozzle of the spray gun was made of titanium.

Subsequently, the plates were uniformly exposed to light from UV-lamps (fluorescent lamps) having a wavelength of the emitted light in a region around 365 nm, whereafter the plates were rinsed in water.

Finally, the plates were electrolessly copper plated until a layer thickness of 2.5–5 μm was obtained by means of a bath which had the following composition per liter:

| | |
|---|---|
| $CuSO_4.5H_2O$ | 7.5 g |
| Formaldehyde 40% | 6 ml |
| tetra Na-salt of ethylenediaminetetra-acetic acid | 21 g |
| NaOH | 2.8 g |
| p-nitrobenzaldehyde | 0.03 g |
| Triton QS 44, i.e. an alkylphenoxy-polyoxy-ethylene phosphate ester having a molecular weight of approximately 800 | 2 g |

The product thus obtained was thereafter processed by means of a known technique to form a printed circuit board, in accordance with the following schedule:

1. applying a negative image of the desired conductor pattern by means of screen printing or photographically with a lacquer which is resistant to electroplating baths.
2. growing a copper layer in an electrodeposition bath on the exposed areas to a thickness of 40 μm.
3. growing an edge resist on the copper in a lead-tin plating bath.
4. removing the lacquer
5. removing the exposed thin copper layer by means of etching
6. heating the printed conductor boards for 2 hours at 120° C., being the prescribed aftertreatment of the starting product.

The patterns obtained had an adherence, expressed as the peel strength for a 3 mm wide conductor, necessary to pull the conductor from the substrate, of 400–500 g.

Comparable results were obtained, starting from commercially available plate material, consisting of a paper-based laminate (layers of paper soaked in phenol-formaldehyde resin) provided with a similar adhesive layer as mentioned in the foregoing.

Example 2

Plate material of the type described in the first example was provided with holes, the aluminum protective layers were removed and the material was roughened mechanically in the same way as described in Example 1.

Thereafter, the plates were rinsed for 10 minutes in a 50% solution of phosphoric acid in water at 70° C. This rinsing operation has to be done prior to the application of the light-sensitive material, as contaminations by metal oxides, more specially iron oxide, which may be contained in the roughening agent may act as catalyst in the electroless copper plating bath. In the additive method described in this example, this may cause copper deposition outside the desired pattern. After this treatment, the plates were rinsed for 10 minutes in demineralized water at ambient temperature and were dried with compressed air.

In a similar manner to that used in the first example, the plates were sprayed with $TiO_2$-particles and thereafter the $PdCl_2$. This operation and the subsequent operations must be performed in a chamber which is shielded from UV-light, of course with the exception of the exposure procedure.

The plates were exposed to light in accordance with a pattern in a vacuum cassette through a photographic negative of the desired pattern by means of a similar light source as used in example 1.

After having been exposed, the plates were rinsed in water, in order to remove the non-reduced palladium chloride and thereafter for 2 minutes at 70° C. in a solution of 30 gl/l aminoacetic acid, the pH of which was brought to a value of 3.0 with hydrochloric acid.

The latent image consisting of metal nuclei on the plates was electrolessly intensified at 70 ± 1° C. to form a 25–30 μm thick copper pattern, by means of a copper plating solution which contained per liter:

960 ml demineralized water 7.5 g copper sulphate 5 aq (p.a.)

21. g tetra-sodium salt of ethylenediamine-tetra-acetic acid 2.8 g NaOH 0.03 g p-nitrobenzaldehyde 6 ml of 40% formalin 2 g Triton QS 44, i.e. an alkyl-phenoxypolyoxyethylene phosphate ester having a molecular weight of approximately 800.

During operation, oxygen was passed through the copper solution, as a result of which the solution obtained a content of $6 \times 10^{-4}$% by weight of dissolved oxygen.

After copper plating the printed circuit boards thus obtained were rinsed, dried and subjected to the prescribed thermal treatment (2 hours at 120° C.).

Also by this method patterns were obtained having an adherence to the board of the same quality as in example 1.

What is claimed is:

1. In a method of producing a printed circuit board on an insulating or non-insulating substrate supplied with a thermosetting adhesive layer, comprising roughening the surface of said adhesive layer, contacting said roughened surface with a liquid capable of providing said roughened surface with metal nuclei capable of being intensified to form a metal layer by an electroless metal plating solution, exposing said metal nuclei to an electroless metal plating solution thereby forming a metal layer on said roughened surface and then heating the resultant assembly, the improvement comprising roughening the surface of said adhesive layer by spraying the surface of said adhesive layer with a suspension of hard particles having a particle size of between 50 and 200 $\mu$m, spraying the thus roughened surface with a suspension of particles of a light sensitive semiconductor metal oxide, which metal oxide, after exposure to light, is capable of releasing copper and/or a metal nobler than copper from a solution of the relevant metal salt, the spraying with the suspension of said metal oxide particles being carried out in such a manner that said metal oxide particles reach said roughened surface in a substantially dry state without drops of the suspension liquid being deposited on said surface, thus providing said roughened surface with a uniformly distributed layer of said metal oxide particles, exposing said layer to light and, either before or after said layer is exposed to light, spraying said layer with a solution of a salt of copper or a metal nobler than copper in a manner such that the particles of said salt reach said layer in a substantially dry state without drops of the liquid of said solution being deposited on said layer, thereby forming metal nuclei in exposed areas of said layer.

2. A method as claimed in claim 1, characterized in that a viscosity-increasing material is added to the suspension and if necessary the solution of the metal salt.

3. A method as claimed in claim 1 or claim 2, characterized in that a surface-active material is added to the suspension and if necessary the solution of the metal salt.

* * * * *